United States Patent
Koch et al.

(10) Patent No.: US 10,462,952 B2
(45) Date of Patent: Nov. 5, 2019

(54) CROP STAND OPTIMIZATION SYSTEMS, METHODS AND APPARATUS

(71) Applicant: THE CLIMATE CORPORATION, San Francisco, CA (US)

(72) Inventors: Justin Koch, Deer Creek, IL (US); Nick Cizek, San Francisco, CA (US)

(73) Assignee: The Climate Corporation, San Francisco, CA (US)

( * ) Notice: Subject to any disclaimer, the term of this patent is extended or adjusted under 35 U.S.C. 154(b) by 320 days.

(21) Appl. No.: 15/304,476

(22) PCT Filed: Apr. 14, 2015

(86) PCT No.: PCT/US2015/025783
§ 371 (c)(1),
(2) Date: Oct. 14, 2016

(87) PCT Pub. No.: WO2015/160827
PCT Pub. Date: Oct. 22, 2015

(65) Prior Publication Data
US 2017/0034986 A1 Feb. 9, 2017

Related U.S. Application Data

(60) Provisional application No. 62/129,366, filed on Mar. 6, 2015, provisional application No. 62/063,184, filed
(Continued)

(51) Int. Cl.
*A01G 2/00* (2018.01)
*A01G 7/00* (2006.01)
(Continued)

(52) U.S. Cl.
CPC .............. *A01B 41/00* (2013.01); *A01B 79/02* (2013.01); *A01C 21/00* (2013.01); *A01D 41/127* (2013.01);
(Continued)

(58) Field of Classification Search
CPC .................................... A01G 2/00; A01G 7/00
(Continued)

(56) References Cited

U.S. PATENT DOCUMENTS 5,764,819 A * 6/1998 Orr ...................... G06K 9/0063
382/110
6,596,996 B1 * 7/2003 Stone ...................... G01J 3/427
250/341.1
(Continued)

FOREIGN PATENT DOCUMENTS

CA 2 663 917 A1 10/2010
CA 2663917 A1 10/2010
(Continued)

OTHER PUBLICATIONS

Colombian Patent Office, "Search Report" in application No. NC2016/0004070, dated Jul. 19, 2018, 3 pages.
(Continued)

*Primary Examiner* — David J Parsley
(74) *Attorney, Agent, or Firm* — Hickman Palermo Becker Bingham LLP

(57) ABSTRACT

Apparatus, systems and methods are provided for crop stand optimization. In some embodiments a field is planted at a first population prescription determined based on a first data set including forecasted weather. A subsequently determined second population prescription is determined based on a second data set determined after planting, and the planted crop is thinned according to the second population prescription. In some embodiments the crop is selectively thinned to remove plants having a plant removal index below a threshold.

11 Claims, 10 Drawing Sheets

Related U.S. Application Data on Oct. 13, 2014, provisional application No. 61/979,246, filed on Apr. 14, 2014.

(51) Int. Cl.

| | | |
|---|---|---|
| *A01B 41/00* | (2006.01) | |
| *A01B 79/02* | (2006.01) | |
| *A01C 21/00* | (2006.01) | |
| *A01D 41/127* | (2006.01) | |
| *G01S 19/13* | (2010.01) | |
| *G06K 9/00* | (2006.01) | |
| *G06T 7/00* | (2017.01) | |
| *H04N 5/247* | (2006.01) | |

(52) U.S. Cl.
CPC ............... *A01G 2/00* (2018.02); *A01G 7/00* (2013.01); *G01S 19/13* (2013.01); *G06K 9/00657* (2013.01); *G06T 7/001* (2013.01); *H04N 5/247* (2013.01); *G06T 2207/30128* (2013.01)

(58) Field of Classification Search
USPC ................ 47/58.1 R, 58.1 LS, 58.1 FV
See application file for complete search history.

(56) References Cited

U.S. PATENT DOCUMENTS

| | | | | |
|---|---|---|---|---|
| 8,135,178 | B2* | 3/2012 | Hendrickson | G06K 9/0063 382/110 |
| 2002/0170229 | A1* | 11/2002 | Ton | A01G 2/00 47/1.7 |
| 2006/0112628 | A1* | 6/2006 | Kotyk | B01L 3/5085 47/58.1 SE |
| 2006/0213167 | A1 | 9/2006 | Koselka et al. | |
| 2010/0046827 | A1 | 2/2010 | Anderson et al. | |
| 2010/0286833 | A1* | 11/2010 | Kaprielian | A01C 23/042 700/284 |
| 2013/0276368 | A1* | 10/2013 | Takayama | A01G 7/00 47/58.1 R |
| 2014/0021267 | A1 | 1/2014 | Sudduth et al. | |
| 2014/0173769 | A1* | 6/2014 | Leyns | A01G 7/00 800/260 |
| 2016/0000021 | A1* | 1/2016 | Sugimoto | A01G 9/24 47/66.6 |

FOREIGN PATENT DOCUMENTS

| | | |
|---|---|---|
| WO | WO 2006/021207 A1 | 3/2006 |
| WO | WO 2012/094116 A1 | 7/2012 |
| WO | WO 2012/094116 A1 | 7/2012 |

OTHER PUBLICATIONS

Colombian Claims in application No. NC2016/0004070, dated Jul. 2018, 4 pages.
Colombian Patent and Trademark Office, "Search Report" in application No. File N ° NC2016 / 0004070, dated Mar. 14, 2018, 10 pages.
Colombian Claims in application No. File N ° NC2016 / 0004070, dated Mar. 2018, 4 pages.
Australian Patent Office, Current Claims in application No. 2015247800, dated Mar. 2018, 4 pages.
Australian Patent Office, "Examination Report No. 1", in application No. 2015247800, dated Mar. 6, 2018, 3 pages.
European Patent Office, "Search Report" in application No. 15779411.6-1656, dated Dec. 4, 2017, 7 pages.
European Claims in application No. 15779411.6-1656, dated Dec. 2017, 3 pages.
Australian Patent Office, "Search Report", in application No. 2015247800, dated Feb. 28, 2019, 5 pages.
Australian Claims in application No. 2015247800 dated Feb. 2019, 4 pages.

* cited by examiner

CROP STAND OPTIMIZATION SYSTEMS, METHODS AND APPARATUS

CROSS-REFERENCE TO RELATED APPLICATIONS

This application is a U.S. National phase of International Application No. PCT/US2015/025783, filed Apr. 14, 2015, which claims priority to U.S. Provisional Application No. 62/129,366, filed Mar. 6, 2015, Provisional Application No. 62/063,184, filed Oct. 13, 2014, and Provisional Application No. 61,979,246, filed Apr. 14, 2014. The contents of each of the applications are incorporated herein by reference as if fully set forth herein.

BACKGROUND

In recent years, advances in seed genetics have increased the potential economic benefits of planting fields at the optimal population (i.e., number of seeds planted per acre). Generally, the optimal population represents the number of plants that optimizes the economic return, and depends on the number of productive plants that can be supported by a given field or region of the field. However, the optimal population is dependent upon the weather and soil conditions in the field between planting and harvest, which must be assumed, estimated or forecasted at the time of planting. Additionally, even at or near the optimal planted population, emerged plants which are known to be unproductive consume resources without providing economic return. As such, there is a need for systems, methods and apparatus of optimizing a crop stand.

DESCRIPTION

Crop Stand Optimization Systems and Apparatus

Figure 1:
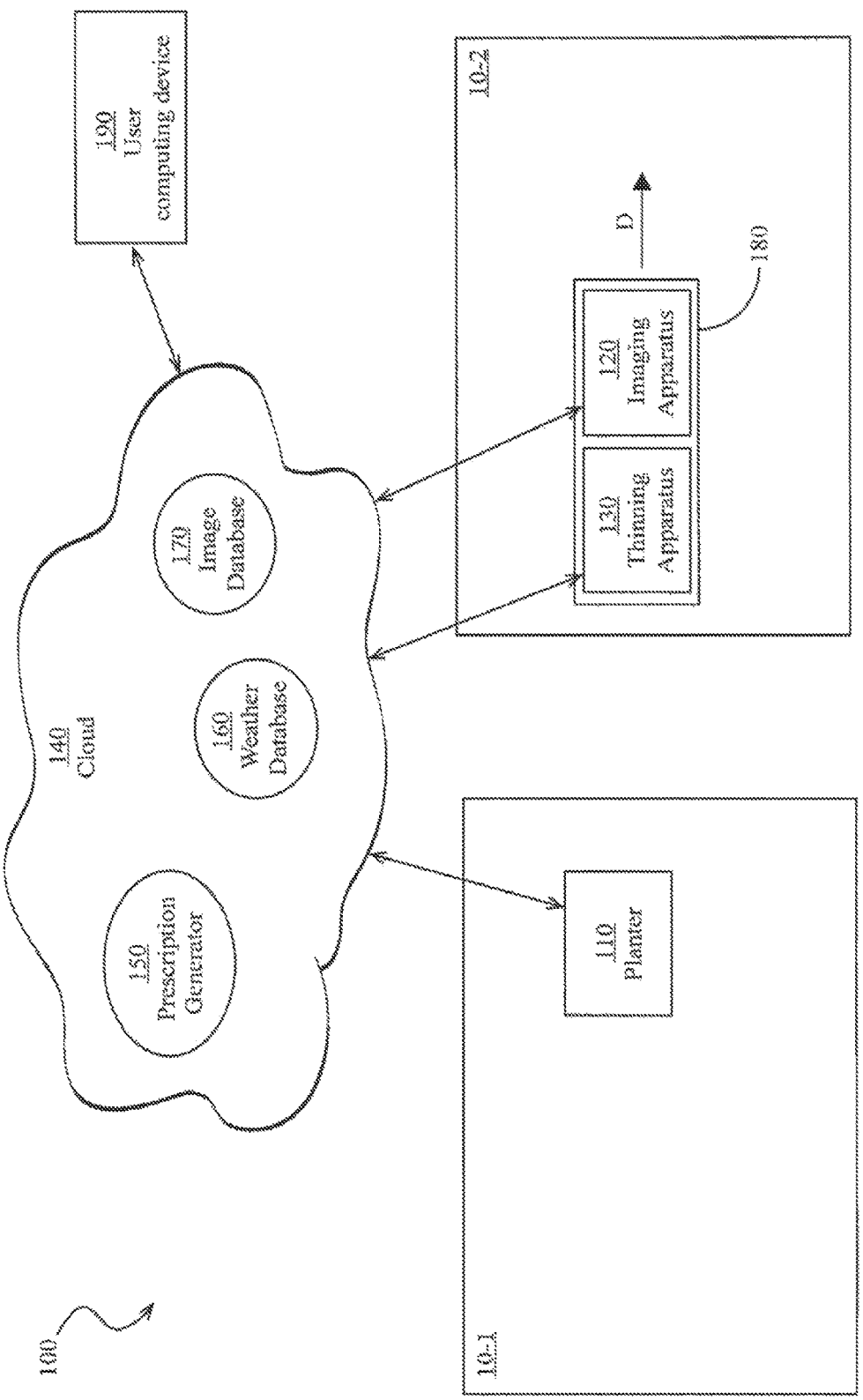
FIG. 1 schematically illustrates an embodiment of a crop stand optimization system.

A crop stand optimization system 100 is illustrated in FIG. 1. A field 10 is illustrated during a planting operation (indicated by reference numeral 10-1) and a subsequent crop reduction operation (indicated by reference numeral 10-2).

During the planting operation, a planter 110 plants a crop in the field 10. The planter 110 preferably includes a GPS receiver and is enabled to plant the field according to a variable-rate prescription (described in detail later herein); the planter is preferably one of the embodiments disclosed in Applicant's co-pending U.S. patent application Ser. No. 13/812,483 (Pub. No. 2013/0124055), incorporated herein by reference. The planter 110 (e.g., a planter monitor of the planter) is preferably in data communication with a data cloud 140 (e.g., via a cellular Internet connection) for transferring data to and receiving data from the cloud. A user computing device 190 (e.g., a personal computer or tablet) is preferably in data communication with the cloud 140; the user preferably views data in-field and off the field on the user computing device 190.

During the crop reduction operation, a thinning apparatus 130 preferably traverses the field and selectively reduces the planted crop by killing, damaging or destroying individual plants as described below. The thinning apparatus 130 preferably includes a GPS receiver for determining the geo-referenced position of the thinning apparatus. The thinning apparatus 130 is preferably in data communication with the cloud 140 for transferring data to and receiving data from the cloud. The thinning apparatus 130 preferably includes a processor and memory for carrying out the processes described herein.

The thinning apparatus 130 is preferably moved across the field by an implement 180. In some embodiments, the implement 180 comprises a self-propelled vehicle, e.g., a motor-driven truck or cart having tracks or wheels. In such embodiments, the implement 180 is preferably sized to fit between rows of corn, e.g., narrower than 30 inches. In other embodiments, the implement 180 comprises a toolbar drawn by a tractor or other vehicle. In such embodiments, the implement 180 may include a plurality of thinning apparatus 130 disposed to selectively reduce planted crop from a plurality of rows.

In some embodiments, the imaging apparatus 120 may be located substantially longitudinally forward of the thinning apparatus during operation, e.g., by mounting one device forward of a toolbar and another device rearward of a toolbar, by mounting one device to the toolbar and another to a drawn cart or supplemental toolbar, or by moving the thinning apparatus through the field in a pass subsequent to the imaging apparatus pass.

In some embodiments the thinning apparatus 130 is configured to selectively apply (e.g., spray) a quantity (e.g., aliquot dose) of liquid on an individual plant, the composition and quantity of the liquid preferably being selected to kill the plant. In some such embodiments, the thinning apparatus 130 applies liquid fertilizer as disclosed in U.S. patent application Ser. No. 12/869,121, incorporated by reference herein. In other embodiments, the thinning apparatus 130 is configured to selectively mechanically damage (e.g., cut, sever, pull from the soil or excise) an individual plant, the amount of damage being sufficient to kill the plant. In still other embodiments, the thinning apparatus 130 comprises one of the embodiments disclosed in any of U.S. patent application Ser. No. 13/788,359 ("the '359 application"); Ser. No. 11/569,715; and Ser. No. 12/869,121; all of which are incorporated by reference herein in their entirety.

The thinning apparatus 130 preferably selectively reduces the planted crop based on data gathered by an imaging apparatus 120. In some embodiments, the imaging apparatus 120 comprises a camera mounted to the implement 180. In such embodiments the thinning apparatus 130 is preferably located aft of the imaging apparatus 120 (i.e., the implement travels along the direction D in FIG. 1) such that the thinning apparatus is able to selectively damage, spray or kill plants based on data gathered by the imaging apparatus during the same pass of the implement 180 through the field. The imaging apparatus 120 is preferably in data communication with the thinning apparatus 130 for transmitting gathered data directly to the thinning apparatus. The imaging apparatus 120 is preferably in data communication with the cloud 140 (e.g., via a cellular Internet connection) for transmitting gathered data to the cloud. In alternative embodiments, the imaging apparatus 120 is not mounted to the implement 180 and instead comprises a camera or other image capture device mounted to a different implement or vehicle; e.g., the imaging apparatus may comprise an airborne camera mounted to an unmanned aerial vehicle ("UAV"), airplane or satellite. In such embodiments, the aerial vehicle preferably includes GPS receiver or other device or system for determining the geo-referenced position of the aerial vehicle.

In each embodiment of the imaging apparatus 120 described in the preceding paragraph, the imaging apparatus 120 may comprise a camera configured to capture images for determining and mapping the normalized difference vegetation index for each location in the field. Alternatively, the imaging apparatus 120 may comprise a visual spectrum camera.

The cloud 140 preferably provides access to a plurality of cloud-hosted databases and software. The cloud 140 preferably provides access to a prescription generator 150 which generates application (e.g., planting population) prescriptions based on soil data, weather data and seed hybrid data. The cloud 140 preferably provides access to a weather database 160 providing current and forecasted atmospheric weather data including air temperature and rainfall as well as known, estimated and forecasted soil condition data including soil temperature and soil moisture. The cloud 140 preferably provides access to an image database 170 storing and providing crop imagery (e.g., photographic, normalized differential vegetation index ("NDVI"), and thermal imagery) gathered by the imaging apparatus 120 or by other crop imagery sources.

Crop Stand Optimization Methods

Figure 2:
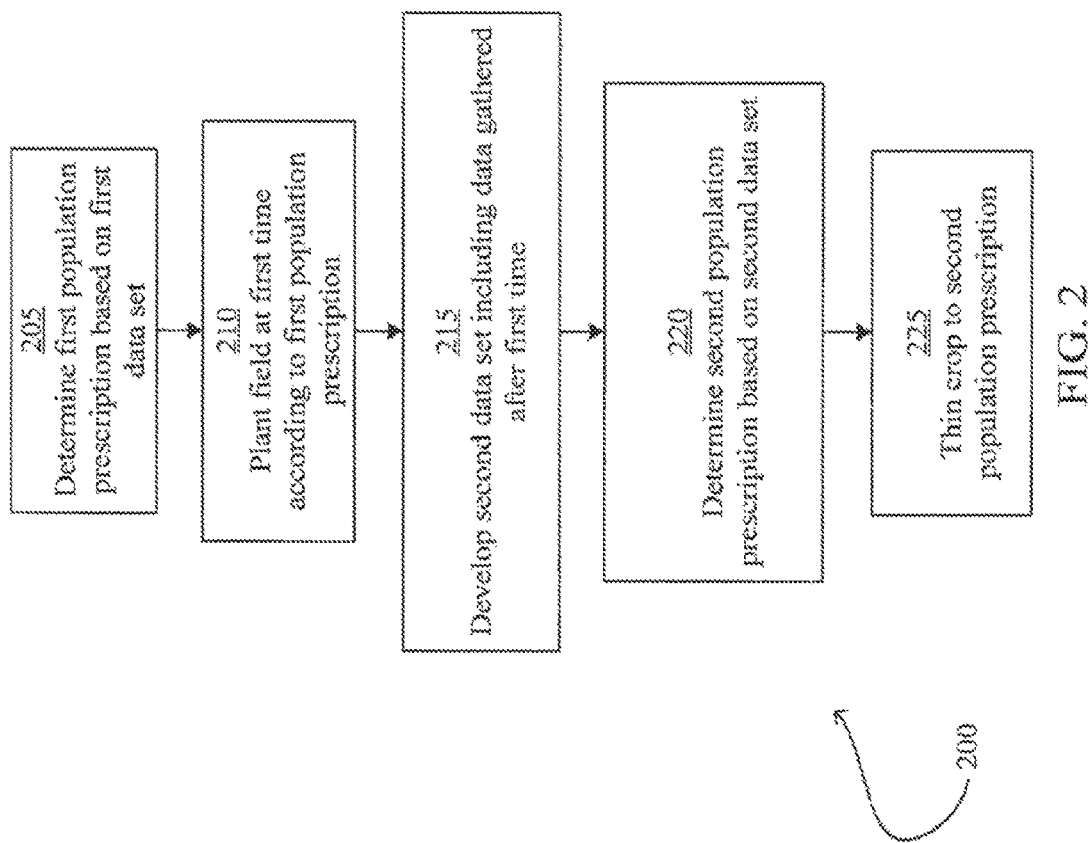
FIG. 2 illustrates an embodiment of a process for optimizing a crop stand.

Turning to FIG. 2, the system 100 is preferably configured to carry out a crop reduction process 200.

Figure 5:
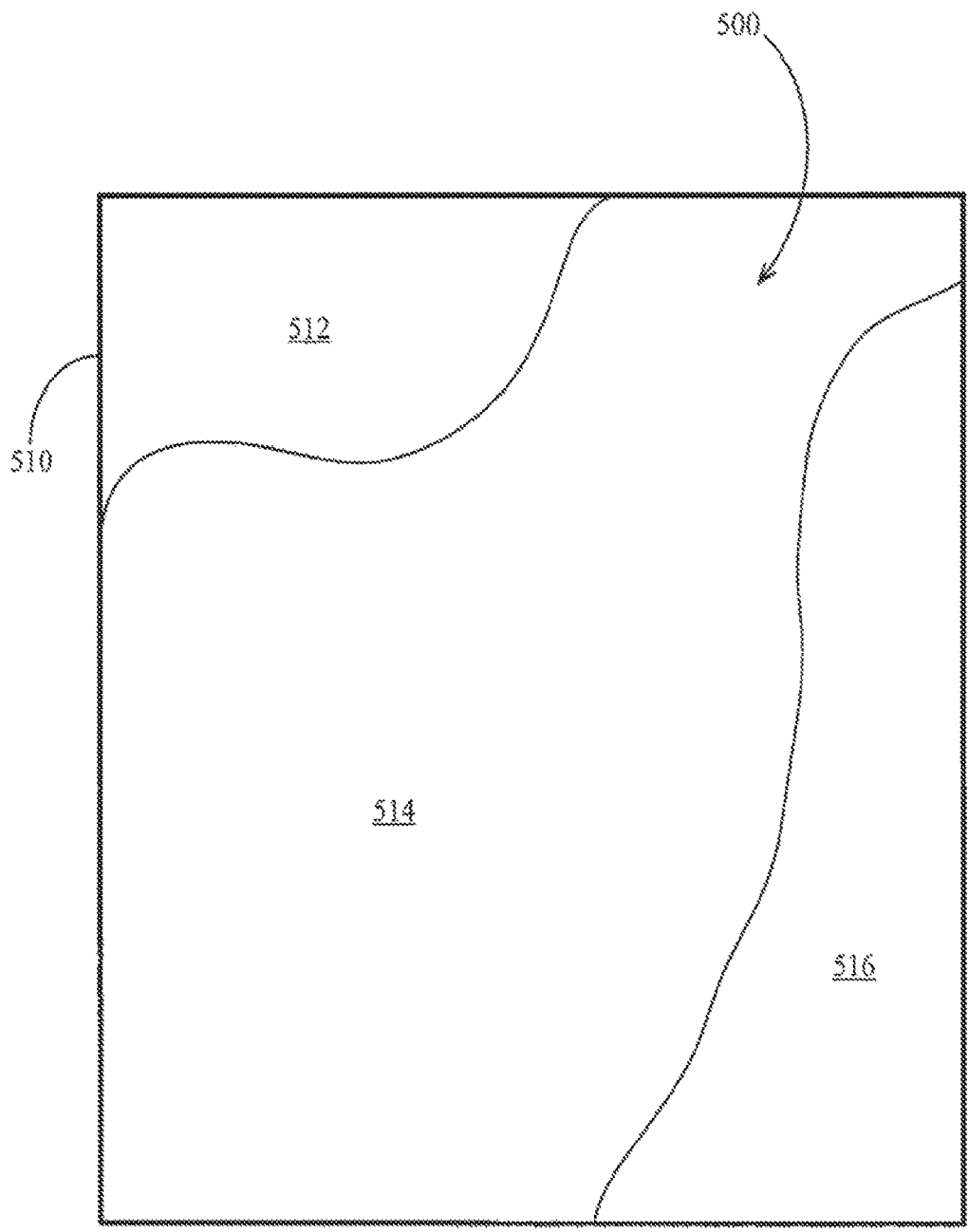
FIG. 5 illustrates an embodiment of a population prescription.

At step 205, a first population prescription is determined (e.g., by the prescription generator 150) based on a first data set. An illustrative example of a population prescription 500 is illustrated in FIG. 5. The prescription 500 prescribes a different planting population for discrete regions 512, 514, 516 within a field boundary 510. As an example, the prescription 500 may prescribe corn plant populations of 30,000 seeds per acre, 32,000 seeds per acre, and 36,000 seeds per acre for the regions 512, 514, 516 respectively.

The first population prescription of step 205 is preferably determined based on a first data set gathered at or prior to the time of the planting operation. The first data set may include data that will not change during the season (e.g., soil type, soil characteristics, seed hybrid properties and yield data from prior seasons). The first data set may also include predicted or model-based data that may change during the season (e.g., predicted weather data throughout the growing season or predicted soil conditions throughout the growing season). The first data set also preferably includes chronological information such as the predicted planting date, the current date and the predicted harvest date.

It should be appreciated that the prescribed population for each region may have a range of values for a range of predicted values. For example, the prescription generator 150 may add 200 seeds per acre to the prescription for each region for each estimated inch of rainfall predicted between an estimated planting date and an estimated harvest date. The weather database 160 preferably provides a range of estimated rainfall (e.g., at a statistical confidence such as 80%). In a preferred embodiment, the first population prescription of step 205 is based on a high-end rainfall prediction. For example, if the weather database provides a 80% confidence interval is between 10 and 20 inches of rainfall corresponding to prescriptions between 30,000 and 32,000 seeds per acre, and the first population prescription of step 205 is preferably 32,000 seeds per acre or greater. In some embodiments, the first population prescription of step 205 corresponds to an optimized (e.g., yield-optimized or revenue-optimized) application rate. In other embodiments, the first population prescription of step 205 corresponds to an application rate equal to the optimized (e.g., yield-optimized or revenue-optimized) application rate multiplied by an overpopulation factor (e.g., 1.01, 1.02, 1.03, 1.04, 1.05, 1.10, 1.20, 1.25, 1.3). The overpopulation factor may be selected based on the range of variation in predicted weather (e.g., estimated rainfall) at a selected confidence interval (e.g., 90%). The overpopulation factor may also be selected based on a crop reduction criterion corresponding to the anticipated crop reduction method; for example, if the anticipated crop reduction method is capable of reducing the population by 50%, an overpopulation factor may be selected such that the first population prescription does not exceed the lowest likely (e.g., at 80% confidence) population to be recommended later in the season by more than 50%.

Returning to FIG. 2, at step 210, the planter 110 preferably plants the field 10 at a first time according to the first population prescription determined at step 20. In some embodiments, the first time (i.e., the date of the first thinning operation) may be recommended based on time-dependent historic and/or predicted data (e.g., a date may be recommended on which predicted weather or soil conditions are conducive to the thinning operation). Additionally, an optimal date or date range on which to gather data (e.g., crop images) in order to determine ear potential may also be recommended; in some examples, the optimal date or date range may be determined based on the estimated growth stage, such as a date range in which the crop has reached a growth stage having identifiable features (e.g., leaves having a threshold length) but prior to the time at which the features (e.g., leaves) are predicted to overlap and obscure overhead images (e.g., based on the highest predicted growth stage of plants in the field, row spacing and/or maximum population in the field).

At step 215, a second data set is determined; the second data set preferably includes data gathered after the first time (e.g., after the time of planting). The second data set may include data that will not change during the season (e.g., soil type, soil characteristics, seed hybrid properties and yield data from prior seasons). The second data set may also include predicted or model-based data that may change during the season (e.g., predicted weather data throughout the growing season or predicted soil conditions throughout the growing season). The second data set also preferably includes chronological information such as the planting date, the current date and the predicted harvest date. As an illustrative example, the second data set may include weather data gathered after the first time and/or a weather forecast based on weather data gathered after the first time.

At step 220, a second population prescription is determined (e.g., by the prescription generator 150) based on the second data set. For example, the prescription generator 150 may add 200 seeds per acre to the prescription for each estimated inch of rainfall predicted between the second time and the estimated harvest date. Unlike the first prescription, the second prescription is preferably not based on a high-end prediction but instead on a median prediction or a value between the median prediction and the high-end prediction.

If the second population prescription for any region of the field is lower than the first population prescription, then at step 225 the system 100 preferably thins the crop in that region to the second population prescription at a second time. In a preferred embodiment, the second time is after the crop has emerged. In the case of corn, the second time is preferably at least a threshold number (e.g., 120) growing degree days after the planting date. In a preferred embodiment, the weather database 160 preferably sends an alert to the user computing device 190 once the threshold number of growing degree days has been reached, such alert preferably includes the second data set and prompts the user to initiate the thinning step 225. In the case of corn, in some embodiments the second time is at or prior to the V6 growing stage, e.g., three weeks or less after the emergence date. In a preferred embodiment, the weather database 160 preferably sends a second alert to the user computing device 190 when the V6 growing stage is approaching, e.g., when a date three weeks after emergence (the date on which the threshold number of growing degree days was met) is approaching. The thinning apparatus 130 preferably reduces the number of plants by damaging or killing (e.g., cutting, extracting, or spraying) individual plants. The thinning apparatus 130 preferably counts the number of plants passed (e.g., based on a contact sensor or a based on images captured by the imaging apparatus 120) and damages or kills every Nth plant according to the relation:

$$N = \text{int}\left(\frac{P_1}{P_1 - P_2}\right)$$

Where: $P_1$=The first population prescription (e.g., 36,000 seeds per acre);
$P_2$=The second population prescription (e.g., 30,100 seeds per acre); and
Function "int( )" returns the nearest integer to its argument.

It should be appreciated that the crop reduction process 200 may be carried out multiple times throughout the growing season. For example, if a third population prescription based on a data set gathered at a third time (e.g., several weeks after the second time) calls for a population less than the second population prescription for any region of the field (e.g., due to a reduced rainfall prediction between the third time and the estimated harvest date), then a second thinning operation may be carried out to further reduce the plant population in that region.

Figure 3:
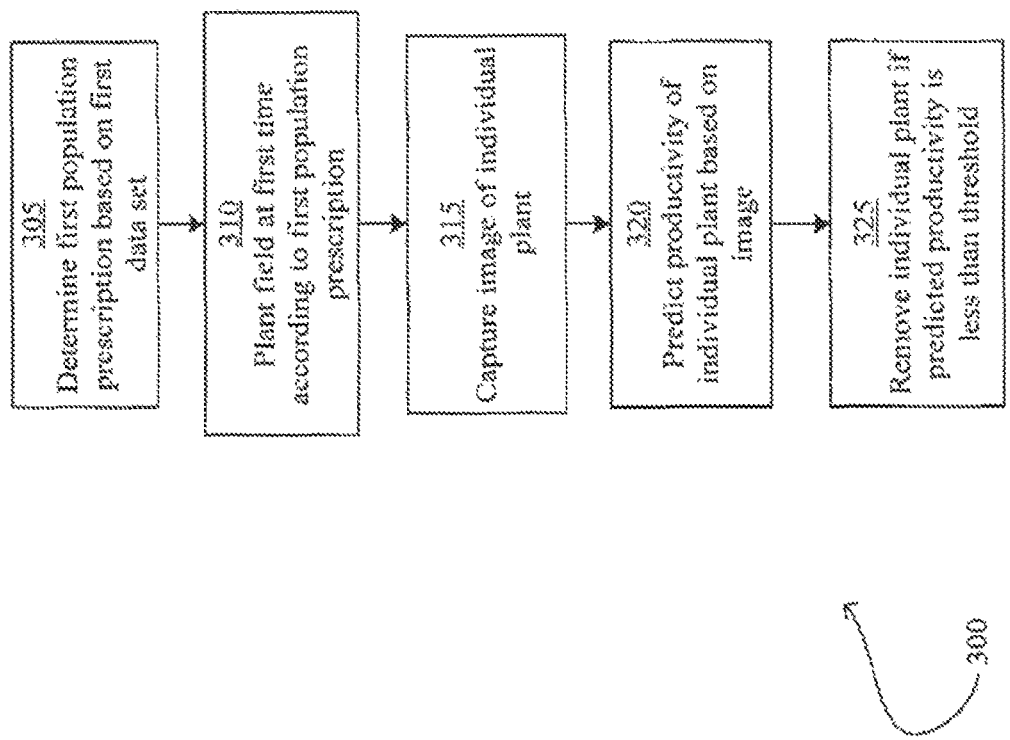
FIG. 3 illustrates an embodiment of another process for optimizing a crop stand.

Turning to FIG. 3, the system 100 is preferably configured to carry out a productivity-based plant elimination process 300. At step 305, a first population prescription is determined (e.g., by the prescription generator 150) based on a first data set, preferably as described above with respect to step 205 of process 200. At step 310, the planter 110 preferably plants the field 10 at a first time according to the first population prescription determined at step 305. In some embodiments, the initial population prescription may be implemented by setting me application rate on a variable rate planting system comprising hydraulic drives or electric motors. In other embodiments, the initial population prescription may be implemented by modifying or substituting a component or components of the planting equipment; for example, a first seed disc having one or more additional seed apertures may be used in planting the first population prescription.

At step 315, the imaging apparatus 120 preferably captures one or more images of one or a plurality of emerged plants in the field 10 (or in some examples a plurality of fields, e.g., a region including a plurality of fields). It should be appreciated that step 315 is carried out at a second time at which the seeds planted at step 310 have emerged as plants.

At step 320, the productivity of one or a plurality of individual emerged plants is estimated based on the image captured at step 315. In some embodiments, the identification and analysis of individual plants may be performed according to the methods disclosed in the '359 application. In some embodiments, the image or images captured at step 315 are transferred to the image database 170 and step 320 is carried out by the image database.

For some crops such as corn, the plant productivity estimated at step 320 may comprise and/or be used to generate an ear potential index. The ear potential index ("EPI") may be determined (e.g., for multiple fields, for a field, for one or more sub-region of the field such as a management zone, for a location in the field, or for an individual plant) using the following equation:

$$EPI = \frac{\text{Ear Potential}}{\text{Intended Population}}$$

Where: Ear Potential=The estimated potential number of ears of corn (e.g., per acre or per field) for the field based on imaging and other information, preferably using any of the methods disclosed in the '859 application and/or the '438 application.
Intended Population=The intended population (e.g., per acre or per field) commanded to be planted (e.g., using a planter enabled to carry out variable-rate seeding according to an application rate map) during planting operations.

In some embodiments, the ear potential and/or EPI values for a field or other region may be calculated based on data gathered from any subset of the field. In some examples, the imaging and other data used to generate ear potential and/or EPI may be measured for each plant. In other examples, the imaging and other data may be measured for a plurality of locations in the field (e.g., two locations, five locations, ten locations, one percent of the surface area of the field, five percent of the surface area of the field, ten percent of the surface area of the field) and spatially interpolated to determine estimated values at the remaining locations in the field. In other examples, the imaging and other data may be gathered at one or more locations in a sub-regions of the field (e.g., in a management zone of the field within which each location has one or more common agronomic criteria and/or is intended to be agriculturally managed with one or more common management criteria) and spatially interpolated to determine estimated values at the remaining locations in the region of the field.

In some examples, the estimated ear potential value for each plant may be based on one or more measured relative plant criteria. Each relative plant criterion is preferably determined by comparing a plant criterion of a plant of interest to the same plant criterion of one or more other plants in the field.

The relative plant criteria may include a relative plant size ratio (e.g., the ratio of the plant height to the average height of all plants in the field, the ratio of the plant height to the average height of plants within a threshold distance of the plant, the ratio of the plant height to the average height of one or more plants adjacent to the plant, the ratio of the plant leaf width to the average leaf width of all plants in the field, the ratio of the plant leaf width to the average leaf width of plants within a threshold distance of the plant, the ratio of the plant leaf width to the average leaf width of one or more plants adjacent to the plant); in some examples, the estimated ear potential may be reduced by a factor directly related to the relative plant size ratio such that the ear potential value decreases with decreasing plant size ratio.

The relative plant location criteria may include one or more plant spacing criteria (e.g., a distance between the plant and the nearest adjacent plant, the average distance between the plant and each adjacent plant, the average distance between the plant and other plants within a threshold distance of the plant, the average distance between the plant and the nearest plants within the same planting row, the average distance between the plant and the nearest plants in the adjacent planting rows). In some embodiments, the ear potential of a plant may be reduced by a factor inversely related to the relative plant criterion; for example, the ear potential may be reduced as the distance between the plant and adjacent plants decreases.

The relative plant criteria may include one or more relative plant orientation criteria (e.g., the relative orientation of leaves in the plant and adjacent plants in a horizontal plane such as the stalk angle θ described below with reference to FIG. 9).

In some embodiments, the relative plant criteria may be used to determine a shading index for the plant which may in turn be used to adjust or estimate the ear potential value. The shading index is preferably directly related an amount of shading (e.g., percentage of surface area) of the plant by adjacent plants and/or a statistical probability of shading of the plant by adjacent plants. In some examples, the shading index may be determined by determining whether there is overlap between leaves of the plant of interest and of any adjacent plants having greater heights than the plant of interest (e.g., based on the leaf length and stalk angle θ of the plant of interest and of the taller adjacent plants). In such examples, the ear potential is preferably reduced by a factor directly related to the shading index.

At step 325, the thinning apparatus 130 preferably damages or kills each plant identified at step 320 as having an estimated productivity below a threshold. Thus it should be appreciated that the estimated productivity comprises a plant elimination index used to decide whether to eliminate a given plant; in other embodiments, the plant elimination index may comprise a different measurement or calculated value such as an NDVI value measured and calculated as is known in the art. The threshold value may be an absolute value; for example, where an NDVI value is determined for each plant, the threshold value may be 0.8. However, in a preferred embodiment the threshold is a relative value based on the plant elimination index found determined for nearby plants or for the rest of the field. For example, where an NDVI value is calculated for each plant, such a relative threshold may be calculated by the ratio between the NDVI value calculated for the plant in question and the average NDVI value calculated for other plants in the field (e.g., all of the plants previously measured in the field, the last 30 plants measured, or plants measured within a threshold distance of the plant in question). In such embodiments, the relative threshold may be 0.75 times the average NDVI value calculated for other plants in the field. In some embodiments, rather than measuring and eliminating plants in the same pass, the imaging apparatus 120 may determine a plant elimination index for each plant in the field in a first pass prior to eliminating any plants in the field with the thinning apparatus 130 in a subsequent pass.

Figure 4:
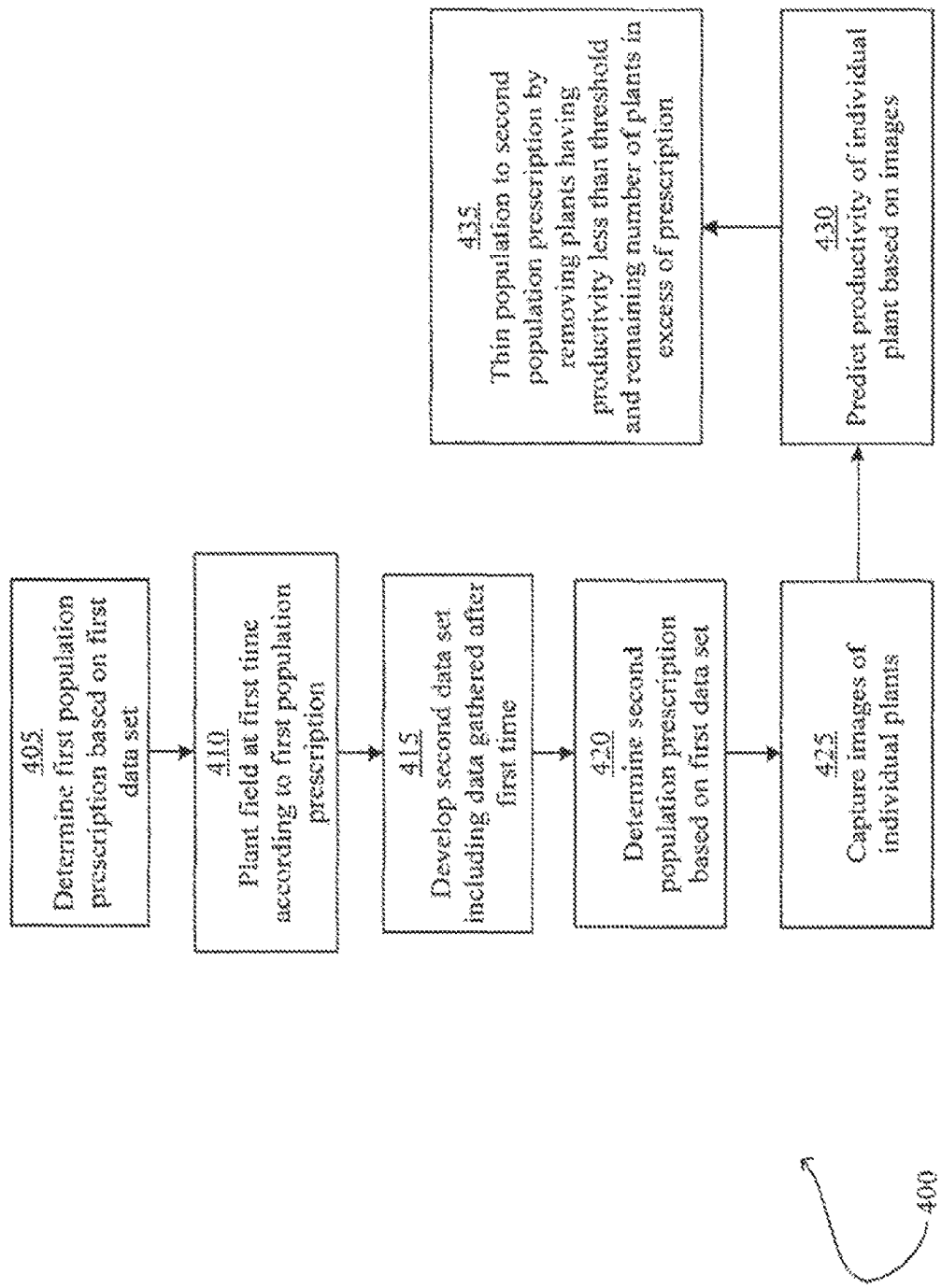
FIG. 4 illustrates an embodiment of yet another process for optimizing a crop stand.

It should be appreciated that the processes 200 and 300 may be performed in sequence and/or repeated throughout the growing season. For example, the process 300 may be performed when the seedlings are 4 to 8 inches tall, and the process 200 may be performed three weeks thereafter. In some embodiments, the system 100 carries out a combined selective elimination and crop reduction process 400 in a single pass through the field as illustrated in FIG. 4. Steps 405, 410, 415 and 420 are preferably carried out as steps 205, 210, 215 and 220 described above, respectively. Step 425 and 430 are preferably carried out as steps 315 and 320 described above, respectively. At step 435, the thinning apparatus 130 preferably reduces the population to the second population prescription by removing plants having a sub-threshold plant removal index (e.g., NDVI value or estimated plant productivity) and additionally removing any additional plants in excess of the prescribed population. In an illustrative embodiment, the thinning apparatus removes all plants having a sub-threshold plant removal index and additionally removes every Nth plant, where N is calculated using the relation:

$$N = \text{int}\left(\frac{P_1^*}{P_1^* - P_2}\right)$$

Where: $P^*_1$=The first population prescription modified by the number of sub-threshold plants already removed, preferably calculated based on the most recent plants evaluated (e.g., the immediately preceding 30 plants evaluated).

Three-Dimensional Imaging Techniques

In some embodiments, one or more images captured in the process 300 may comprise a three-dimensional image, preferably including a three-dimensional image or one or more plants. The three-dimensional image (e.g., comprising a three-dimensional point cloud) may be captured by any appropriate system including laser-based systems (e.g., Lidar); radar-based systems; light-field cameras (e.g., those available from Lytro, Inc. in Mountain View, Calif.); or systems for processing visual and/or infrared images into three-dimensional images (e.g., those employing range-imaging techniques such as structure-from-motion). In such embodiments, the obtained or generated three-dimensional image may be analyzed to identify and measure plant characteristics and features including those described in the '359 application. For example, fruiting characteristics (e.g., number of ears of corn, size of ears of corn, orientation of ears of corn, morphological characteristics of ears of corn), leaf number, size (e.g., length), leaf orientation (e.g., vertical angular orientation relative to a horizontal plane or horizontal angular orientation relative to a vertical plane defined by the planting trench), and plant health characteristics (e.g., biomass or NDVI values of individual plants, fields, or regions) may be measured by identifying features of a three-dimensional plant image having expected characteristics (e.g., height, length) associated with those features. In some embodiments, the relative position of plants or plant features (e.g., stalks, leaves) in the images captured in the process 300 (e.g., three-dimensional or two-dimensional images) may be analyzed to determine whether one plant is shading another. In one such example, if a height of adjacent (e.g., neighboring) plants differs by a threshold percentage (e.g., 20%) it may be determined that the taller plant is shading the other. In another example, if a height of adjacent (e.g., neighboring) plants differs by a threshold percentage (e.g., 20%) and the leaf area of the taller plant exceeds a threshold value, it may be determined that the taller plant is shading the other. The estimated productivity determined in the process may be based, inter alia, on the plant features and characteristics determined as described herein.

In some embodiments, the use of three-dimensional images to analyze plant features enables identifying and characterizing plant features at later stages than is practical using two-dimensional images. For example, three-dimensional images of corn plants past the canopy development stage may be used to identify features (e.g., leaves and ears) located below the canopy and thus difficult to identify or characterize using two-dimensional images.

In some examples, the three-dimensional (and other) images acquired as described herein may be gathered using imaging systems on aerial platforms (e.g., airplanes, helicopters, fixed-wing or quad-copter UAVs), satellites, mobile ground-based platforms (e.g., tractors or other general-purpose vehicles, agricultural implements, dedicated imaging vehicles such as wheeled or tracked mobile imaging carts having autonomous GPS-based guidance), and/or stationary ground-based platforms (e.g., towers, buildings).

Plant Removal and Imaging

Figure 7:
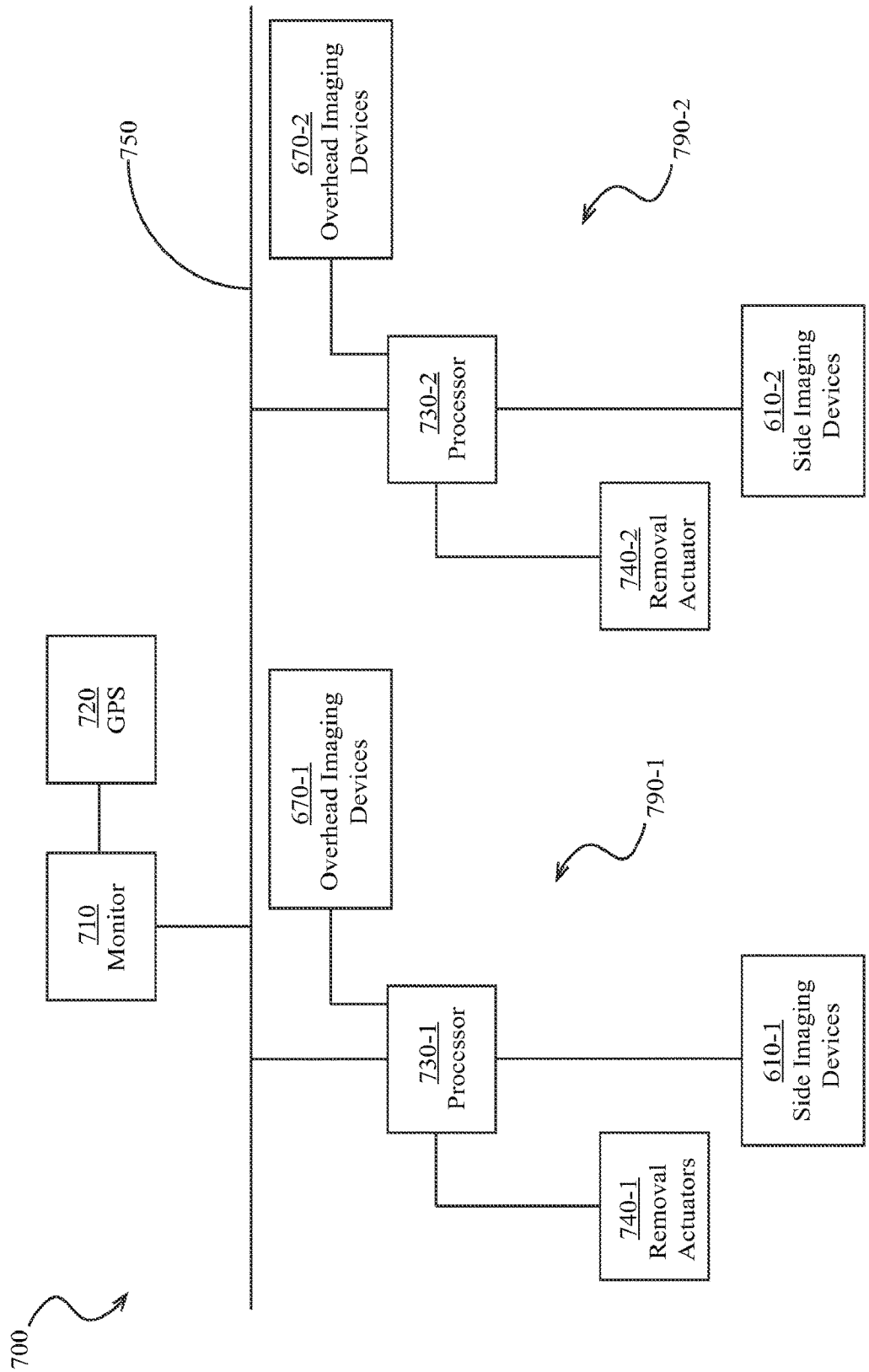
FIG. 7 schematically illustrates a general embodiment of a plant removal and imaging system.

Turning to FIG. 7, a plant removal and imaging system 700 is illustrated schematically. The system 700 is preferably mounted to the implement 180 and may comprise an embodiment of the imaging and thinning apparatus 120,130 described above. The system 700 preferably includes a monitor 710 in data communication with a GPS receiver 720. The monitor 710 preferably includes a graphical user interface, a processor and a memory for storing and accessing plant location, image processing software and other data. The monitor 710 is preferably in data communication with one or more row units 790, in some embodiments via a bus 750 (e.g., a CAN bus). Each row unit 790 preferably comprises a processor 730 in data communication with one or more overhead imaging devices 670, one or more side imaging devices 610, and one or more removal actuators 740.

In operation, as the system 700 moves through the field the system preferably captures plant images and selectively removes ("removes" as used herein meaning any destructive action including the following: destroys, exterminates, damages, kills, uproots, over-fertilizes, poisons) plants based on a plant characteristic, e.g., a plant image characteristic. The plant characteristic may be determined based on an image obtained by the imaging devices 610 and/or imaging devices 670; in other embodiments, the plant characteristic may be determined by an image or other sensor data gathered by another device (e.g., an aerial or satellite device) or by an earlier field pass executed by the same implement 180, preferably associated with the GPS-reported location of the implement using geo-referenced plant data. In other embodiments, the system 700 removes plants at regular intervals in order to reduce the plant population to a selected population. The system 700 preferably also records spatially maps the locations of removed plants.

Figure 6A:
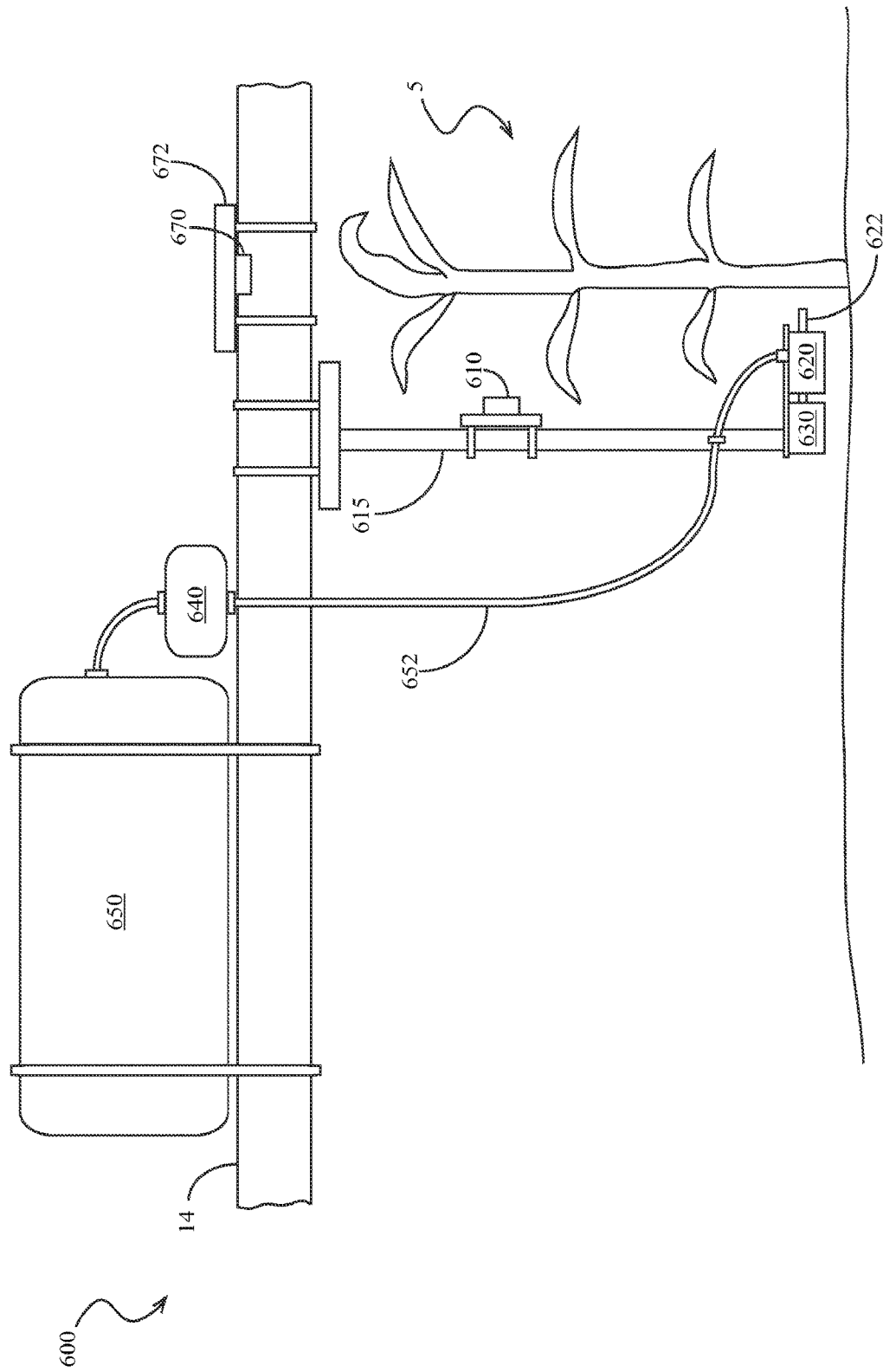
FIG. 6A is a rear elevation view of an embodiment of a plant removal and imaging system having a liquid injection subsystem.

Turning to FIG. 6A, an embodiment of a plant removal and imaging system 600 is illustrated. It should be appreciated that a single row of the system 600 is illustrated; in multi-row implementations in which a toolbar is drawn through the field, the system 600 preferably includes a plurality of row units, each of which is preferably disposed between two rows of plants. In such multi-row implementations, first and second row units may be disposed between two rows of plants, the first row unit oriented to capture images of and remove plants from a first row and a second row unit oriented to capture images of and remove plants from a second row.

The system 600 preferably includes a plant removal subsystem including a liquid tank 650 supplying a fluid (e.g., air or other gas or liquid such as water, mineral slurry, fertilizer, or herbicide) to an outlet 622 via a fluid line 652. In some embodiments the outlet 622 is supported adjacent the row of plants 5 and is preferably oriented to direct fluid toward the plants 5. To that end a bracket 615 preferably suspends the outlet 622 from a drawn toolbar 14 and adjacent the above-ground base (e.g., the root ball or stalk base) of the plants 5. In some embodiments, a pump 640 pumps liquid at a selective rate from the tank 650 to the outlet 622. In some embodiments, the outlet 622 ejects a jet of fluid (e.g., water) at a velocity sufficient to remove the plant. In such embodiments, a collection tank 620 adjacent and upstream of the outlet 622 preferably collects fluid until the processor 730 or monitor 710 commands a removal action, upon which an injector 630 preferably quickly pressurizes the collection tank 620 such that fluid is ejected from the outlet 622 in order to remove any plant adjacent to the outlet. It should be appreciated that a valve upstream of the outlet 622 may be closed until it is opened either in response to the removal action command or the pressurization of the collection tank 620. The injector 630 may comprise an injector having a piston (e.g., a spring-loaded piston) configured to quickly increase the pressure in the collection tank 620. It should be appreciated that the pump 640 and/or the injector 630 may be considered removal actuators 740 of the system 700.

Continuing to refer to FIG. 6A, the system 600 preferably includes an imaging subsystem comprising one or more side imaging devices 610 (e.g., cameras or reflectivity sensors) 610 disposed to capture a side view image of the plants 5. The side view imaging devices 610 are preferably suspended from the toolbar 14 by the bracket 615. Additionally, the system 600 preferably includes one or more overhead imaging devices 670 disposed to capture a top view image of the plants 5. The overhead imaging devices 670 are preferably suspended from the toolbar 14 by a bracket 672. It should be appreciated that in some embodiments the side view imaging devices 610 are disposed transversely further from the row of plants 5 than the outlet 622 such that the imaging devices are disposed to capture a full or substantial part image of each plant while the outlet is disposed to apply fluid directly to the plants.

Figure 6B:
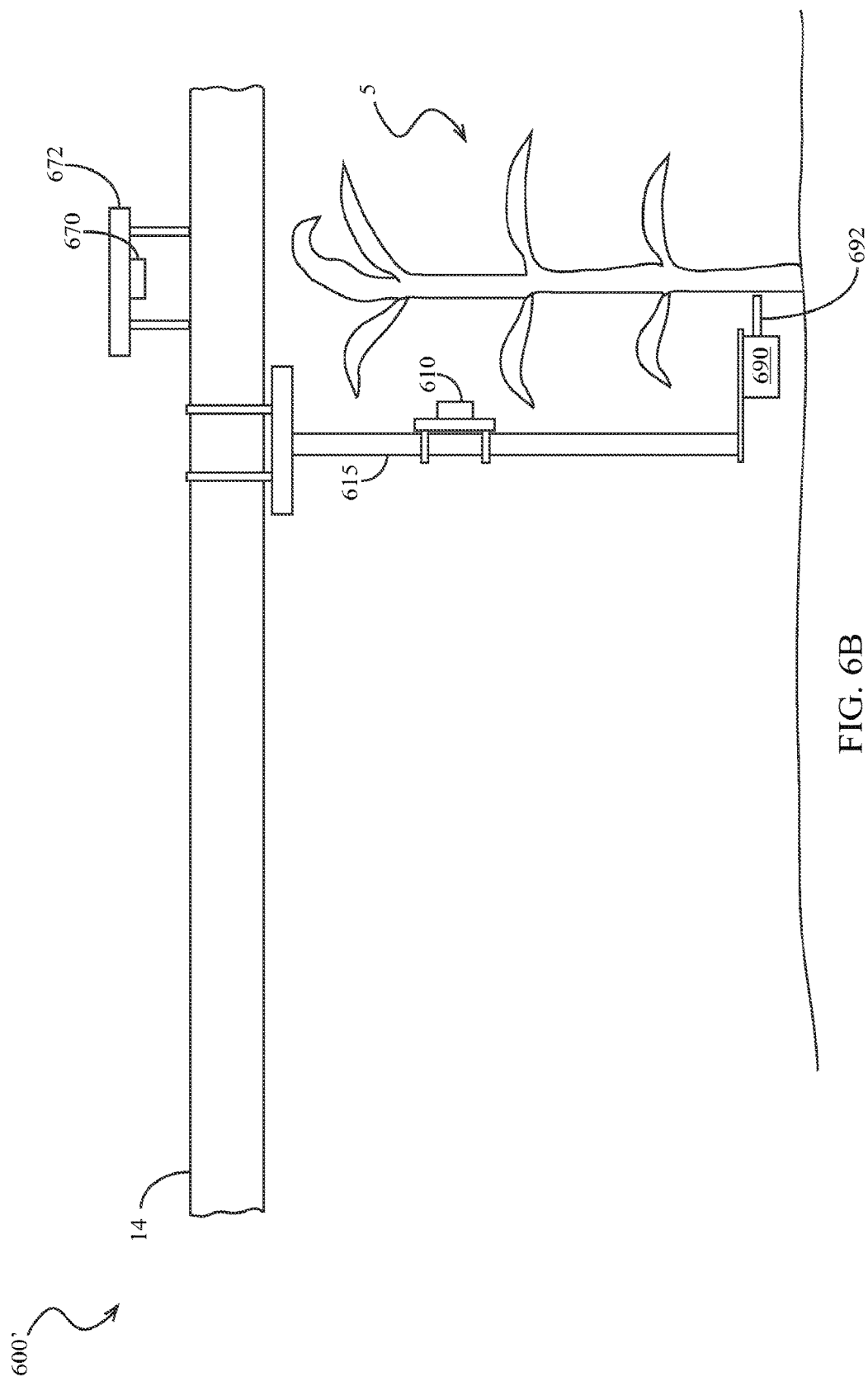
FIG. 6B is a rear elevation view of another embodiment of a plant removal and imaging system having a plant cutting subsystem.

Turning to FIG. 6B, another embodiment of a plant removal and imaging system 600' is illustrated. The system 600' is preferably similar to the system 600 described above, but instead of (or in addition to) the plant removal subsystem of the system 600 used to apply a fluid to plants 5, the system 600' includes a mechanical plant removal subsystem comprises a cutting device 690 which mechanically cuts or otherwise damages the plant. The cutting device 690 preferably includes one or more blades 692 suspended by the bracket 615 and disposed adjacent to the row of plants 5. The cutting device 690 may comprise a servo motor or linear actuator configured to selectively move the blade or blades 692 into contact with the plant 650, preferably with the above-ground base of the plant. The blade 692 may comprise a circular saw, a straight blade, or a pair of oscillating cutting blades. In operation, in response to a command from the monitor 710 or processor 730, the cutting device 690 moves the blade 692 into contact with the plant 5 such that the plant is removed by the cutting action of the cutting device 690 and/or the longitudinal movement of the blade 692 as the implement 180 moves through the field.

Figure 10:
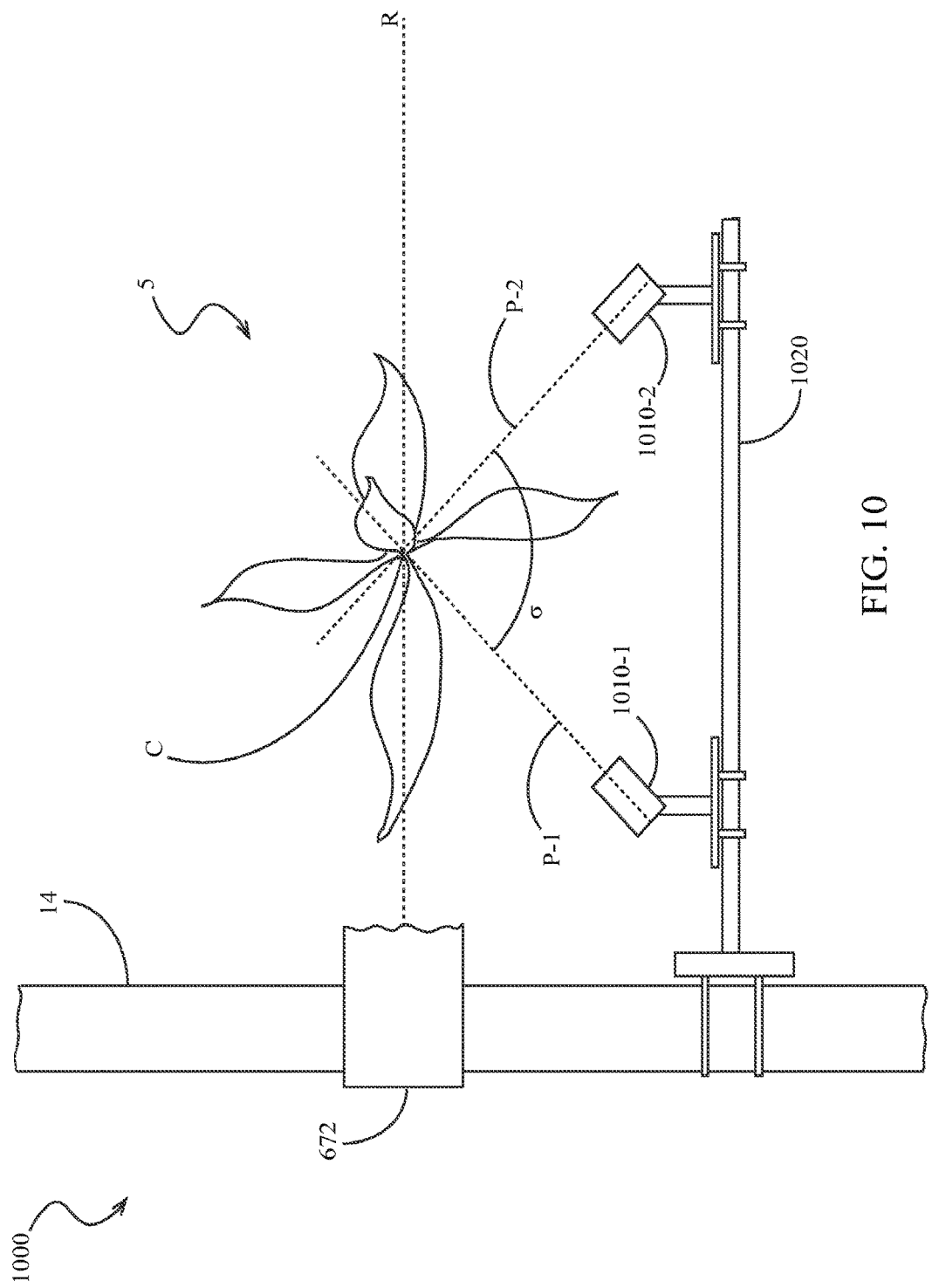
FIG. 10 is a top view of an embodiment of an embodiment of plant removal and imaging system.

Turning to FIG. 10, an alternative embodiment of a plant removal and imaging system 1000 is illustrated in which the side imaging devices 610 comprise a plurality of angled imaging devices 1010 (e.g., cameras or reflectivity sensors) disposed to capture a side view image of the plant 5. The imaging devices 1010 are preferably supported by a bracket 1020 suspended from the toolbar 14. A viewing axis P-1 (e.g., the central viewing axis) of a first imaging device 1010-1 preferably intersects a viewing axis P-2 (e.g., the central viewing axis) of a second imaging device 1010-2 at a plane R defining the row of plants 5. A relative angle σ between the viewing axes P-1 and P-2 is preferably 90 degrees. A vertical viewing axis (e.g., the central viewing axis) of the overhead imaging device 670 preferably also intersects the viewing axes P-1 and/or P-2 of the angled imaging devices 1010.

In operation of the system 1000, the overhead imaging device 670 and the angled imaging devices 1010 each capture an image of the same plant 5 as the implement 180 moves through the field. In some implementations, each angled imaging device 1010 captures an image when the stalk center C of the plant 5 intersects the viewing axis P of the imaging device (where the axes P-1, P-2 intersect the plane R as described above, both imaging devices may each capture an image simultaneously). In some implementations, the overhead imaging device continuously takes images (e.g., at intervals of 1 millisecond) and determines when the stalk center C intersects the viewing axis of the stalk sensor (or will intersect the stalk center within a threshold time), upon which the angled imaging devices 1010 are commanded to capture an image immediately or after passage of a predetermined time. In some implementations, each of the imaging devices takes images simultaneously. In other implementations, the image captured by one or more of the angled imaging devices 1010 is taken when the angled imaging device 1010 reaches a desired location relative to the plant 5. In some such implementations, a first image is taken by the overhead imaging device 670 and a stalk angle θ (see FIG. 9) of the plant 5 is determined based on the first image; the desired location of the angled imaging device 1010 relative to the plant 5 (at which a second image is taken by the angled imaging device) is determined based on the stalk angle. For example, the processor 730 may determine location at which the angled imaging device will view the plant 5 at an angle normal to the stalk angle, or as close as possible to normal.

Instead of or in addition to taking images at selected times, the imaging subsystem may continuously gather images (e.g., at regular intervals such as 0.2 milliseconds or 1 millisecond) at each device or record a continuous video at each device throughout the operation. Thus it should be appreciated that where the step of taking an image is described herein, such step may comprise actually taking a single image or sampling an image from a continuously recorded series of images or video.

In some embodiments, one imaging device (e.g., the overhead imaging device) may be located substantially longitudinally forward of another imaging device (e.g., a side imaging device) during operation, e.g., by mounting one device forward of the toolbar and another device rearward of the toolbar, by mounting one device to the toolbar and another to a drawn cart or supplemental toolbar, or by capturing the same image in a later pass through the field.

Figure 9:
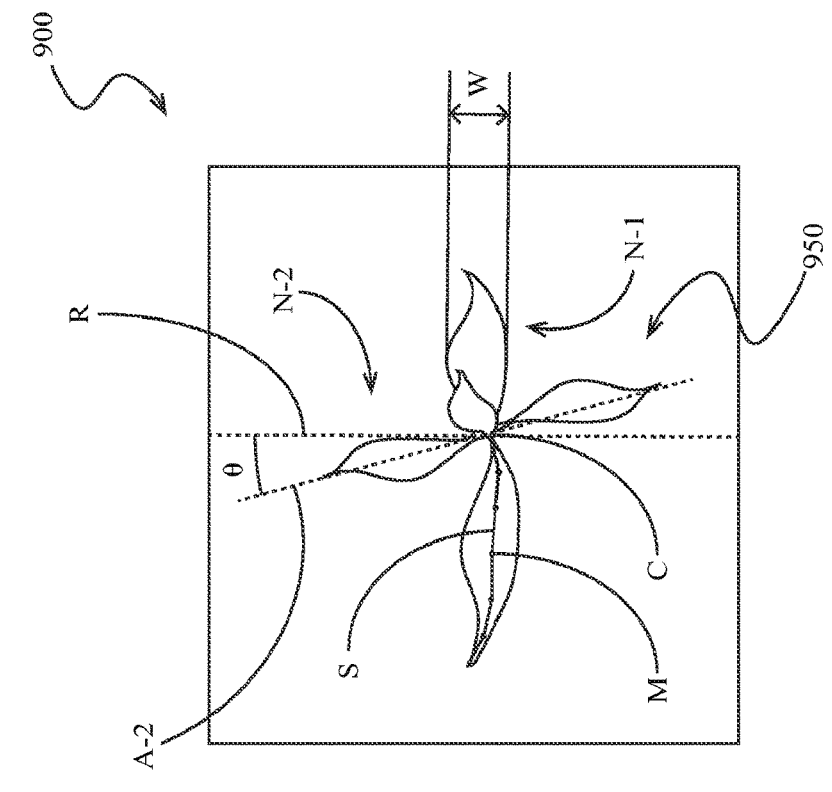
FIG. 9 illustrates a top view image of a plant.
Figure 8:
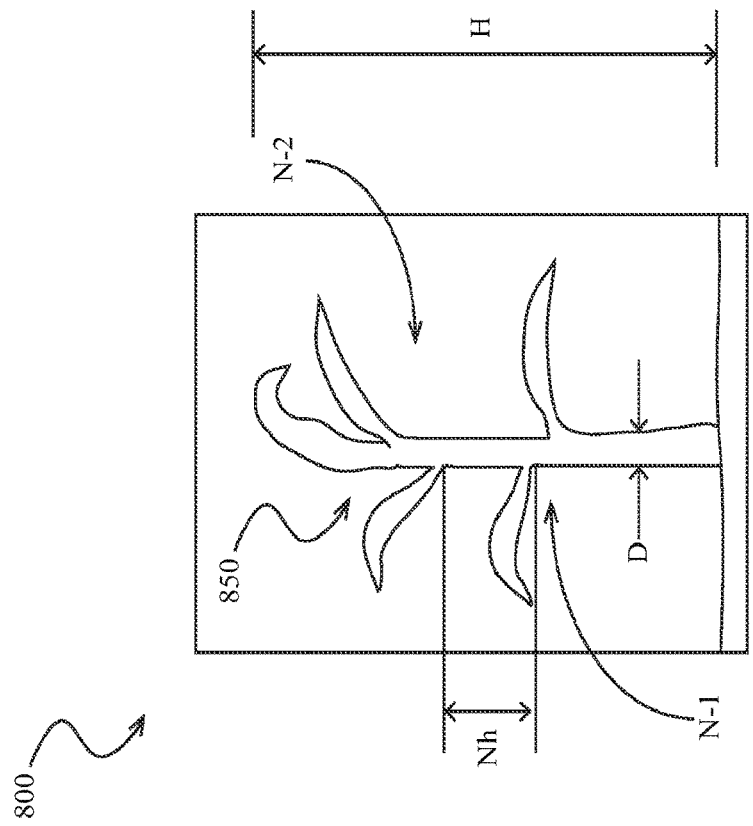
FIG. 8 illustrates a side image of a plant.

Turning to FIGS. 8 and 9, a representative side image 800 and a representative overhead image 900 are illustrated respectively. A plurality of plant characteristics may be determined from the plant images, including the characteristics determined as disclosed in U.S. Provisional Patent Application No. 62/040,859 ("the '859 application") and/or U.S. Provisional Patent Application No. 62/046,438 ("the '438 application"), the entirety of both of which are hereby incorporated by reference herein. The characteristics may be used to determine a plant health or growth stage, including a relative health or growth stage in comparison with neighboring or nearby plants, as also disclosed in the '859 application and/or the '438 application.

Referring to FIG. 8, in some embodiments the imaging subsystem estimates a height H of the plant 5, e.g., by identifying a plant portion 850 within the image and measuring the maximum vertical extent of the plant portion. In some embodiments, the imaging subsystem identifies a location (e.g., a vertical location) of one or more nodes N. In the illustrated representative images, the plant 5 (e.g., a corn plant) has a first node N-1 comprising two opposing leaves and a second node N-2 comprising two opposing leaves. In some embodiments, the imaging subsystem identifies the location of nodes N-1 and N-2 by identifying vertical locations at which the width of the plant portion 850 is beyond a threshold percentage or deviation from a width of a lower portion of the plant portion. In some embodiments, the imaging subsystem estimates the height H based on node height Nh representing the vertical distance between the nodes N-1 and N-2, e.g., using an empirical relationship between Nh and the plant height. In other embodiments, the imaging subsystem estimates the plant growth stage or growth progress based on the value of Nh. The imaging subsystem also preferably estimates a stalk width D of the plant 5, e.g., by estimating the greatest width of the plant portion 850 vertically below the identified node N-1.

Referring to FIG. 9, the imaging subsystem may also identify and determine characteristics the leaves of nodes N-1 and N-2 by analyzing a plant portion 950 of the overhead image 900. It should be appreciated that the overhead image may be captured by the imaging subsystem or by a separate vehicle or aircraft (e.g., a UAV) during a simultaneous or prior operation. The imaging subsystem preferably determines the plane R corresponding to the row of plants (i.e., the planting trench), which determination may be based on the location of the overhead imaging device 670 or may be made as disclosed in the '859 application and/or the '438 application. The imaging subsystem preferably determines the stalk angle θ defining the angular offset of the plane A defining the growth direction of leaves in each node N, e.g., the offset from the plane R as illustrated. In some embodiments, the imaging subsystem modifies the measured stalk diameter D based on the stalk angle θ. For example, for crops (e.g., corn) for which stalks are oblong and have their longest diameter in the plane A, the imaging subsystem preferably reduces the diameter D estimated by a side-view image taken normal to the plane R by a factor that increases with the stalk angle θ.

In addition, the imaging subsystem preferably determines the width W of leaves in each node N, e.g., by identifying each leaf portion in the plant portion 950 and determining the greatest width measured normal to a plane passing through the center C of the plant portion (e.g., the geometric center of that portion of the plant portion that intersects the row plane R) and the endpoint of the leaf portion. The imaging subsystem also preferably identifies a leaf spine S by establishing a series of line segments between a plurality leaf midpoints M and determines a length of the leaf (i.e. the leaf spine) as described in the '859 application and/or the '438 application.

The foregoing description is presented to enable one of ordinary skill in the art to make and use the invention and is provided in the context of a patent application and its requirements. Various modifications to the preferred embodiment of the apparatus, and the general principles and features of the system and methods described herein will be readily apparent to those of skill in the art. Thus, the present invention is not to be limited to the embodiments of the apparatus, system and methods described above and illustrated in the drawing figures, but is to be accorded the widest scope consistent with the spirit and scope of the appended claims.

The invention claimed is:

1. A method of optimizing the stand of a planted crop, comprising:
    determining a first optimized population prescription based on a first data set gathered prior to a first time;
    planting a field at said first time according to said first population prescription;
    capturing a first image of an individual plant in said field;
    predicting a productivity of said individual plant based on a physical characteristic of said individual plant in said first image, said productivity of said individual plant relating to a yield of said individual plant; and
    removing said individual plant if said predicted productivity is less than a threshold productivity.

2. The method of claim 1, wherein said predicted productivity is related to a predicted number of ears produced by said plant.

3. The method of claim 2, wherein said predicted number of ears is based on the relative characteristics of two adjacent plants.

4. The method of claim 1, wherein said characteristic of said first image comprises a leaf orientation.

5. The method of claim 1, wherein said characteristic of said first image comprises a leaf length.

6. The method of claim 1, wherein said characteristic of said first image comprises a leaf width.

7. The method of claim 1, wherein said characteristic of said first image comprises a stalk width.

8. The method of claim 1, wherein said characteristic of said first image comprises a distance between nodes of a corn plant.

9. The method of claim 1, wherein said first image is captured by a first camera positioned to the side of said individual plant, and wherein said first camera is supported by an imaging implement configured to traverse said field.

10. The method of claim 1, wherein a second image of said individual is captured by a second camera, wherein said second camera captures said second image simultaneously with said first image, and wherein said second camera is supported by said imaging implement.

11. The method of claim 1, wherein a second image of said individual is captured by a second camera, wherein said second image comprises an aerial image.

* * * * *